(12) United States Patent
Park et al.

(10) Patent No.: US 7,153,000 B2
(45) Date of Patent: Dec. 26, 2006

(54) MULTI-LENS LIGHT EMITTING DIODE

(75) Inventors: Jung Kyu Park, Kyungki-do (KR); Young Sam Park, Seoul (KR); Hun Joo Hahm, Kyungki-do (KR); Young June Jeong, Kyungki-do (KR); Hyung Suk Kim, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 80 days.

(21) Appl. No.: 10/957,650

(22) Filed: Oct. 5, 2004

(65) Prior Publication Data

US 2006/0034082 A1    Feb. 16, 2006

(30) Foreign Application Priority Data

Aug. 12, 2004   (KR) ............... 10-2004-0063630

(51) Int. Cl.
*F21V 3/02* (2006.01)

(52) U.S. Cl. ............... 362/268; 362/329; 362/331; 362/800; 257/79; 257/99; 257/98; 257/100

(58) Field of Classification Search ............... 362/268, 362/328, 329, 331, 800, 612; 257/97–100, 257/79; 313/512
See application file for complete search history.

(56) References Cited

U.S. PATENT DOCUMENTS 3,875,456 A * 4/1975 Kano et al. ............... 313/501

6,896,381 B1 * 5/2005 Benitez et al. ............... 359/858
2005/0224829 A1 * 10/2005 Negley et al. ............... 257/99

FOREIGN PATENT DOCUMENTS

KR    2002-19579    3/2002
KR    10-0405453    11/2003

* cited by examiner

*Primary Examiner*—Stephen F Husar
*Assistant Examiner*—Meghan K. Dunwiddie
(74) *Attorney, Agent, or Firm*—Lowe Hauptman & Berner, LLP.

(57) ABSTRACT

A multi-lens LED has multiple lenses and an intermediate layer interposed between the multiple lenses in order to radiate light emitted from an LED chip in a desired direction and/or at a desired beam angle. The first lens is centered behind the LED chip when seen in the propagation direction of light. The second lens has a concave structure and surrounds the first lens. The intermediate layer is interposed between the first and second lenses, so that light emitted from the LED chip can be radiated at a wide beam angle. When provided in the form of a hemisphere, the multi-lens LED can be attached, e.g., to a wall or a ceiling for interior lighting. On the other hand, when provided in the form of a semicylinder, the multi-lens LEDs can be arranged in arrays to be used, e.g., as a light source of an LCD backlight apparatus.

20 Claims, 7 Drawing Sheets

MULTI-LENS LIGHT EMITTING DIODE

RELATED APPLICATION

The present application is based on, and claims priority from, Korean Application Number 2004-63630, filed on Aug. 12, 2004, the disclosure of which is hereby incorporated by reference herein in its entirety.

BACKGROUND OF THE INVENTION

1. Field of the Invention

The present invention relates to a Light Emitting Diode (LED), more particularly, which has multiple lenses and an intermediate layer between the lenses in order to radiate light from an LED chip in a desired direction and/or beam angle without using a complicated lens configuration.

2. Description of the Related Art

A typical LED is fabricated by a following process, in which an LED chip is placed on a reflector, the chip are connected with leads via wires, and resin material for example transparent resin is molded over a resultant structure. Then, light beams emitted from the LED chip are radiated to the outside in a specific beam angle according to the geometry of the reflector and the configuration of the molded resin.

The beam angle is very small in case of a lamp-type LED. Although a dome-type LED has a relatively larger beam angle, the beam angle is generally within 120°.

An approach to widen the beam angle is disclosed in Korea Patent No. 10-405453, entitled "Chip Light Emitting Diode and Fabrication Method Thereof." The LED disclosed in the above document includes a PCB, a metal pad and leads installed on the PCB at a predetermined distance, an LED chip mounted on the metal pad, wires electrically connecting the LED chip with the leads and a molding package rounded over the PCB to cover the LED chip, the wires and the leads.

The LED can increase the beam angle from conventional 120° up to about 160° according to the configuration of the rounded molding package.

However, this approach also fails to disclose any means for realizing a beam angle exceeding 160°. In addition, this approach neither discloses any solution for realizing a narrow beam angle in a specific range.

SUMMARY OF THE INVENTION

The present invention has been made to solve the foregoing problems of the prior art and it is therefore an object of the present invention to provide a multi-lens LED which has multiple lenses and an intermediate layer interposed between the multiple lenses in order to radiate light emitted from an LED chip in a desired direction and/or beam angle without using a complicated lens configuration.

It is another object of the present invention to provide a multi-lens LED which includes a first lens centered behind an LED chip when seen in the propagation direction of light, a concave second lens surrounding the first lens and an intermediate layer interposed between the first and second lenses in order to radiate light emitted from the LED chip in a wide beam angle, and preferably, up to about 180°.

It is further another object of the present invention to provide a multi-lens LED which includes a first lens centered ahead of an LED chip when seen in the propagation direction of light, a convex second lens surrounding the first lens and an intermediate layer interposed between the first and second lens in order to radiate light emitted from an LED chip in a narrow beam angle, more particularly, in a specific direction.

According to an aspect of the present invention for realizing the foregoing objects, there is provided a multi-lens LED comprising: a board; an LED chip mounted on the board; a substantially hemispherical first lens placed on the board surrounding the LED chip to direct light emitted from the LED chip in the range of a predetermined beam angle; a substantially hemispherical second lens placed around the first lens at a predetermined space, and having a configuration corresponding to that of the first lens; and an intermediate layer interposed between the first and second lenses, and made of a material showing significant refractivity difference from those of the first and second lenses.

Preferably, the first lens is smaller than a hemisphere, and the second lens is a concave lens.

Preferably, the first lens is larger than a hemisphere, and the second lens is a convex lens.

In the meantime, the terminologies "hemisphere" or "substantially hemispheric" used herein include various convex configurations projected from a plane, and therefore are not necessarily limited to the half of a sphere.

According to an aspect of the present invention for realizing the foregoing objects, there is provided a multi-lens LED comprising: a board; an LED chip mounted within a reflector on the board, the reflector being adapted to spread light in one axial direction while focusing light in another axial direction; a substantially semi-cylindrical first lens placed on the board surrounding the LED chip on the board along the spreading axial direction to introduce light from the LED chip in a predetermined beam angle; a substantially semi-cylindrical second lens placed around the first lens at a predetermined space, and having a configuration corresponding to that of the first lens; and an intermediate layer interposed between the first and second lenses, and made of a material showing significant refractivity difference from those of the first and second lenses.

Preferably, the first lens is smaller than the half of a cylinder, and wherein the second lens is a concave lens.

Preferably, the first lens is larger than the half of a cylinder, and wherein the second lens is a convex lens.

In any of the foregoing LEDs, it is preferred that the first and second lenses are made of a resin having a refractivity of about at least 1.5 and the intermediate layer is formed of air.

Any of the foregoing LEDs may further comprise a transparent elastic body tightly contacting an inner surface of the first lens while sealing the LED chip, the transparent elastic body having a refractivity substantially the same as that of the first lens.

Preferably, the first lens has an outer surface including a number of faces, each of the faces being connected with adjacent one of the faces at a predetermined angle.

Preferably, the second lens has inner and outer surfaces, at least one of the inner and outer surfaces including a number of faces, each of the faces being connected with adjacent one of the faces at a predetermined angle.

Preferably, the second lens has an inner surface in close contact with an outer surface of the first lens, and wherein the first lens is made of a transparent material having large refractivity difference from that of the second lens.

In addition, any of the foregoing LEDs may further comprise at least one substantially semi-cylindrical third lens having a configuration corresponding to that of the second lens, the third lens being placed around the second lens at a predetermined space.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
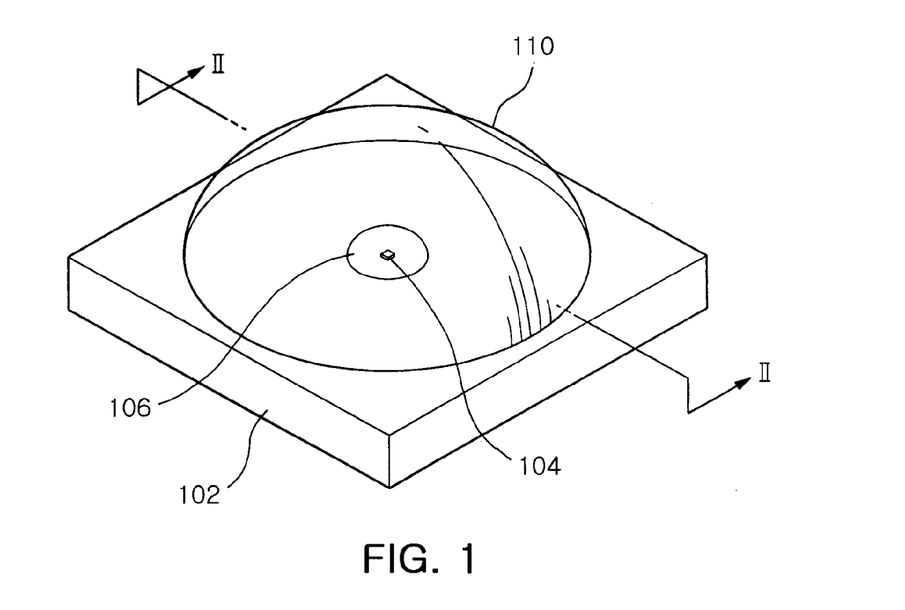
FIG. 1 is a perspective view of a multi-lens LED according to a first embodiment of the present invention.
Figure 2:
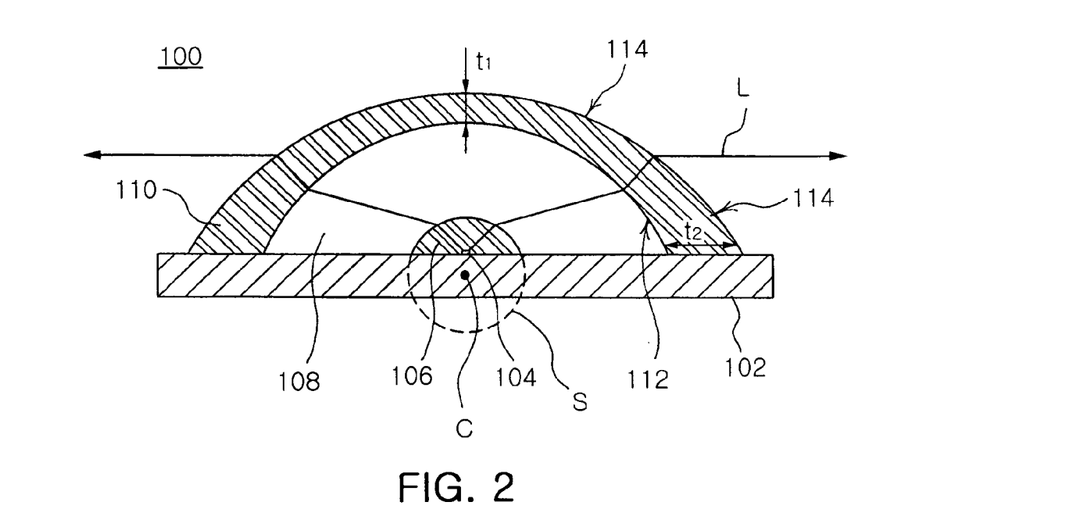
FIG. 2 is a cross-sectional view of the multi-lens LED taken along the line II—II in FIG. 1.
Figure 2A:
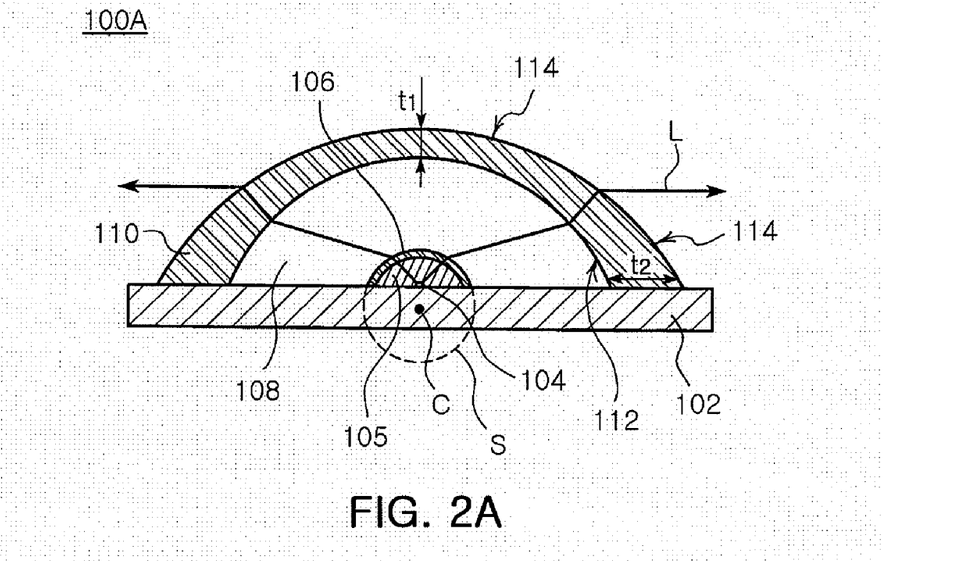
FIG. 2A is a cross-sectional view of a variation to the multi-lens LED shown in FIG. 2.
Figure 2B:
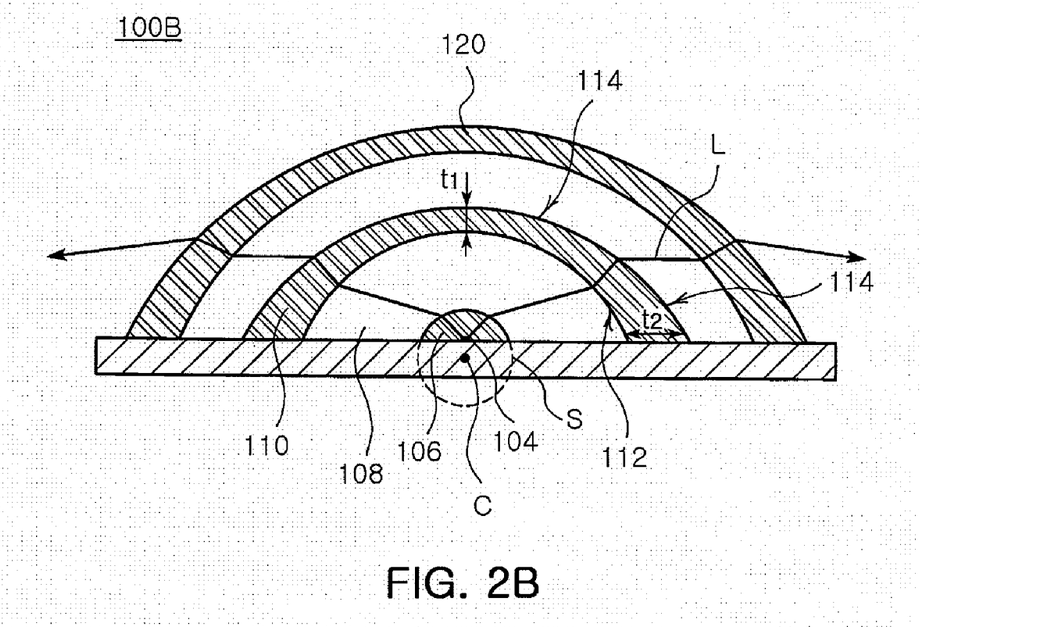
FIG. 2B is a cross-sectional view of another variation to the multi-lens LED shown in FIG. 2.
Figure 3:
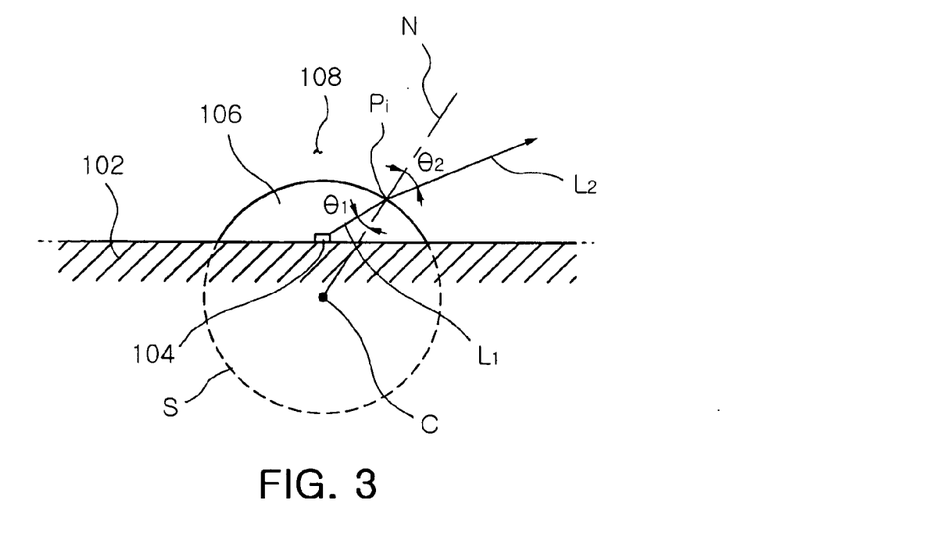
FIG. 3 is a conceptual view illustrating the principle of the multi-lens LED according to the first embodiment of the present invention.

Hereinafter a multi-lens LED according to a first embodiment of the present invention will be described with reference to FIGS. 1 to 3, in which FIG. 1 is a perspective view of the multi-lens LED according to the first embodiment of the present invention, FIG. 2 is a cross-sectional view of the multi-lens LED taken along the line II—II in FIG. 1, FIG. 2A is a cross-sectional view of a variation to the multi-lens LED shown in FIG. 2, FIG. 2B is a cross-sectional view of another variation to the multi-lens LED shown in FIG. 2, and FIG. 3 is a conceptual view illustrating the principle of the multi-lens LED according to the first embodiment of the present invention.

As shown in FIGS. 1 to 3, a multi-lens LED 100 according to the first embodiment of the invention includes a board 102 printed with patterns (not shown), an LED chip 104 mounted on the board 102, a first lens 106 for sealing the LED chip 104 and a second lens 110 placed on the board 102 around the first lens 106 at a predetermined space. In addition, an intermediate air layer 108 is form of the air filled between the first and second lenses 106 and 110.

Though not shown in FIGS. 1 to 3, the multi-lens LED 100 of the invention also has several components provided in the board 102 like a typical LED. These components include leads for supplying external voltage to the LED chip 104, a semi-elliptical reflector for reflecting light emitted from the LED chip 104 in an upward direction and a metal pad for radiating heat generated from the LED chip 104 to the outside.

The first and second lenses 106 and 110 are molded from transparent resin, and alternatively, may be formed of other transparent material such as plastic and glass. In addition, as shown in FIG. 2A, gel-like elastic resin 105 such as silicone can be filled between the first lens 106 and the LED chip 104. Such resin material has excellent optical properties since it has high refractivity and resistance against yellowing, that is, change in quality induced by single wavelength light. Unlike epoxy which is to be solidified, this rein material still remains in a gel or elastomer state even after being cured, and thus can more stably protect the LED chip 104 against thermal stress, vibration and external impact.

The first lens 106 forms a portion of a sphere S which is drawn in part with a dotted line. The sphere S has a center C located behind the LED chip 104 when seen in the propagation direction of light. In addition, the second lens 110 is a portion of a hollow sphere in which inner and outer surfaces 112 and 114 have different diameters and centers. In this case, though not illustrated in detail, the centers of the hollow sphere including the lens 110 are located behind the LED chip 104 when seen in the propagation direction of light. Also, the inner surface 112 is centered ahead of the outer surface 114 when seen in the propagation direction of light. Accordingly, the second lens 110 which is delineated by the first and second surfaces 114 and 116 has a concave lens structure. The second lens 110 has the smallest thickness $t_1$ in a central portion of the second lens 110 located in the direct front of the LED chip 104 when seen in the propagation direction of light (or directly upward from the LED chip 104 in FIG. 2) and the largest thickness $t_2$ in the periphery of the lens 110 in contact with the board 102.

The operation of the multi-lens LED 100 of this structure will be described with reference to FIGS. 2 and 3.

First, as can be seen from FIG. 3, light generated from the LED chip 104 is incident into the intermediate layer 108 or the air layer between the first lens 106 and the second lens 110 via the first lens 106 (after passing through an elastic body if any). The first lens 106 and the intermediate layer 108 are of materials having different refractivity. That is, the first lens 106 made of for example transparent resin has a refractivity of about 1.5 but the intermediate layer 108 made of for example the air has a refractivity of 1. In the meantime, the elastic body made of for example silicone has a refractivity of about 1.5. When introduced into the intermediate layer 108 via the first lens 106 from the LED chip 104, a light beam $L_1$ has a specific incidence angle $\theta_1$ with respect to the surface of the sphere S, that is, the interface between the first lens 106 and the intermediate layer 108. The incidence angle $\theta_1$ is defined between the incidence light beam $L_1$ and a normal line N on the incidence point $P_i$, that is, a straight line drawn along the center C of the sphere S and the incidence point $P_i$. Since the air or medium in the intermediate layer 108 has a refractivity 1 that is different from the refractivity 1.5 of the first lens 106, the incidence angle $\theta_2$ of a radiation beam $L_2$ radiated from the incidence point $P_i$ on the surface of the sphere S into the intermediate layer 108 is determined according to Snell's Law which explains the refraction of light as in Equation 1 below:

$$n_1 \cdot \sin \theta_1 = n_2 \cdot \sin \theta_2 \qquad \text{Equation 1,}$$

wherein $n_1$ is a refractivity of the first lens 106, $\theta_1$ is an incidence angle from the first lens 106 into the interface, that is, the outer surface of the sphere S, $n_2$ is a refractivity of the intermediate layer 108, and $\theta_2$ is a radiation angle from the interface to the intermediate angle 108.

In this embodiment, the relation $\theta_2 > \theta_1$ is obtained since the first lens 106 as the first medium has a refractivity of about 1.5 and the intermediate layer 108 as the second medium has a refractivity of 1. Then, as can be seen from FIG. 3, the radiation beam L2 radiates into the intermediate layer 108 at the radiation angle $\theta_2$ with respect to the normal line N that is larger than that of the incidence angle $\theta_1$. Therefore, it can be understood that the first lens 106 serves to spread light beams emitted from the LED chip 104.

After being introduced from the first lens 106 into the intermediate layer 108, the light beam also radiates to the ambient air. Since the second lens 110 is of the concave lens structure as described above, the second lens 110 serves to horizontally spread all of light beams L that propagate through the same.

Therefore, the LED lenses 106 and 110 according to the first embodiment of the invention cooperate to double the beam angle of the light beams L emitted from the LED chip 104 in a horizontal direction. Modification to the refractivity and configuration of the multiple lenses 106 and 110 may spread the light beams L to have a beam angle increased up to 180°. In addition, the present invention can increase the number of lenses to more efficiently increase or adjust the beam angle.

As shown in FIG. 2B, a third lens 120 may be placed on the board 102 around the second lens 114 at a predetermined space.

While the first embodiment has been described that the intermediate layer 108 is of the air, the intermediate layer 108 may be made of other suitable medium having a large refractivity difference from those of the first and second lenses 106 and 110.

Alternatively, it is possible to omit the intermediate layer 108 where the second lens 110 is formed of a transparent material having a large refractivity difference from the first lens 106 in order to realize the objects of the present invention. In this case, for example, the refractivity of the second lens is preferably smaller than that of the first lens but larger than that of the ambient air.

In addition, the LED chip 104 may be realized in the form of a single chip or a combination of plural chips. The LED chip 104 may be also selected to emit monochromatic or white light.

Although the multi-lens LED 100 of this embodiment has been described that the surfaces of the first and second lenses 106 and 110 are partial regions of spheres, they are not necessarily spherical surfaces. For example, each of the first and second lenses may have a flat central portion with its periphery being uniformly rounded in order to increase the beam angle of a light beam passing through the lens. In addition, the lens surface may be elliptic or hyperbolic. Therefore, it is to be understood that such terminologies "hemisphere" or "substantially hemispheric" used herein include various configurations as above.

The multi-lens LED 100 of this embodiment is especially advantageous where the LED is attached to a flat surface such as a wall and a ceiling in order to radiate light uniformly and hemispherically opposite to the flat surface. For instance, the multi-lens LED 100 can be applied to an interior lighting device which is attached to the wall.

Unlike to the foregoing first embodiment, the first lens may be centered ahead of the LED chip when seen in the propagation direction of light and the second lens may be of a convex configuration to surround the first lens with the intermediate layer being interposed between the first and second lenses so that light from the LED chip can radiate in a narrow beam angle, in particular, in a specific direction.

Figure 4:
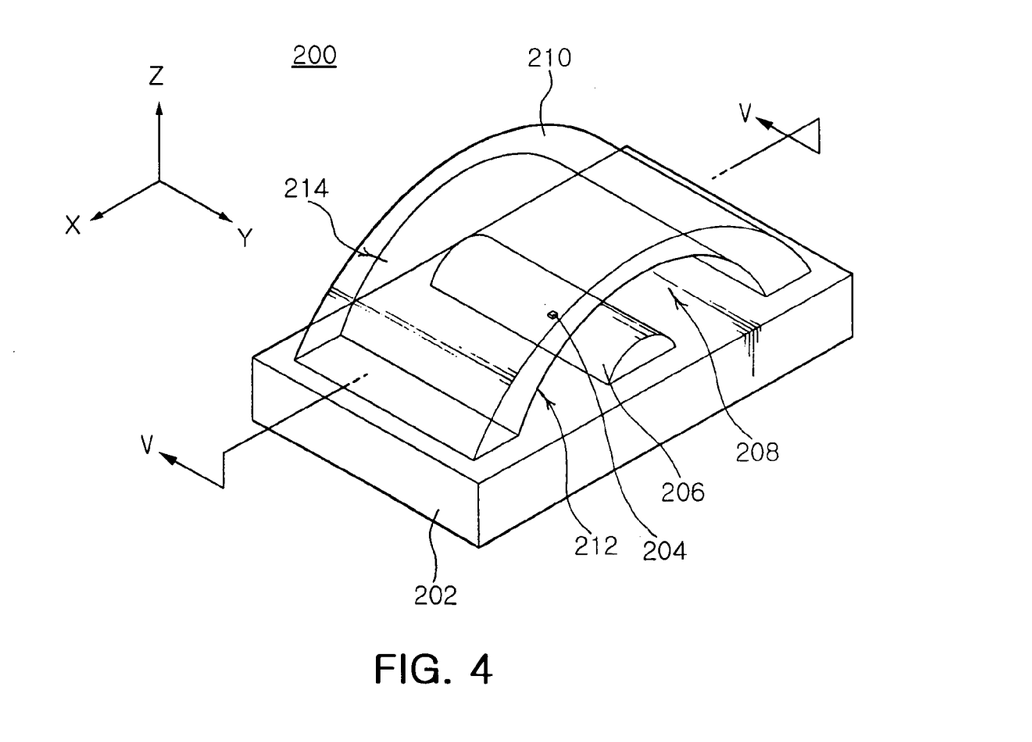
FIG. 4 is a perspective view of a multi-lens LED according to a second embodiment of the present invention.
Figure 5:
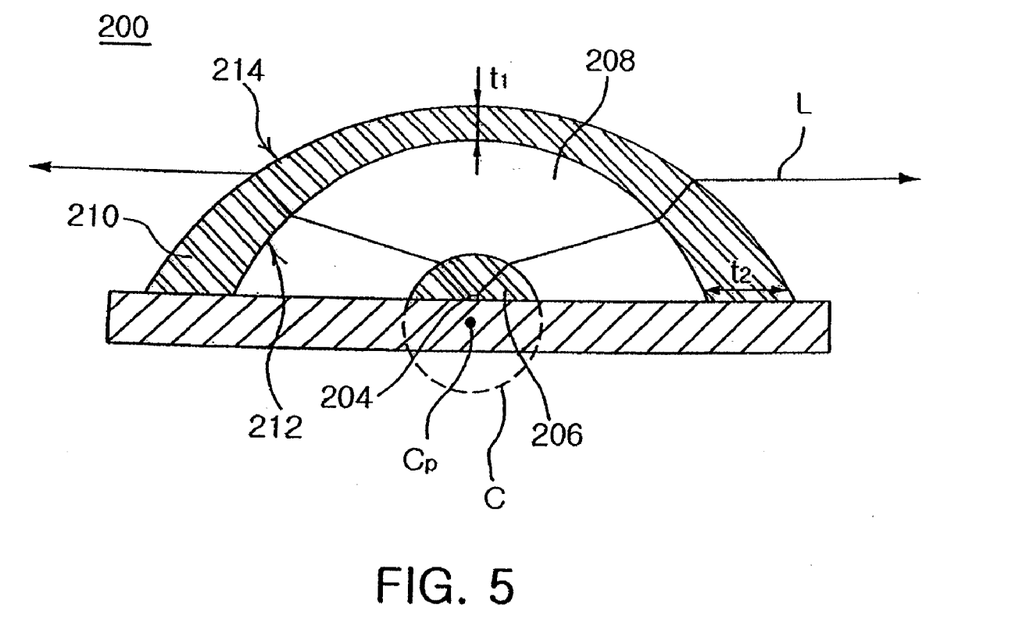
FIG. 5 is a cross-sectional view of the multi-lens LED taken along the line V—V in FIG. 4.
Figure 6:
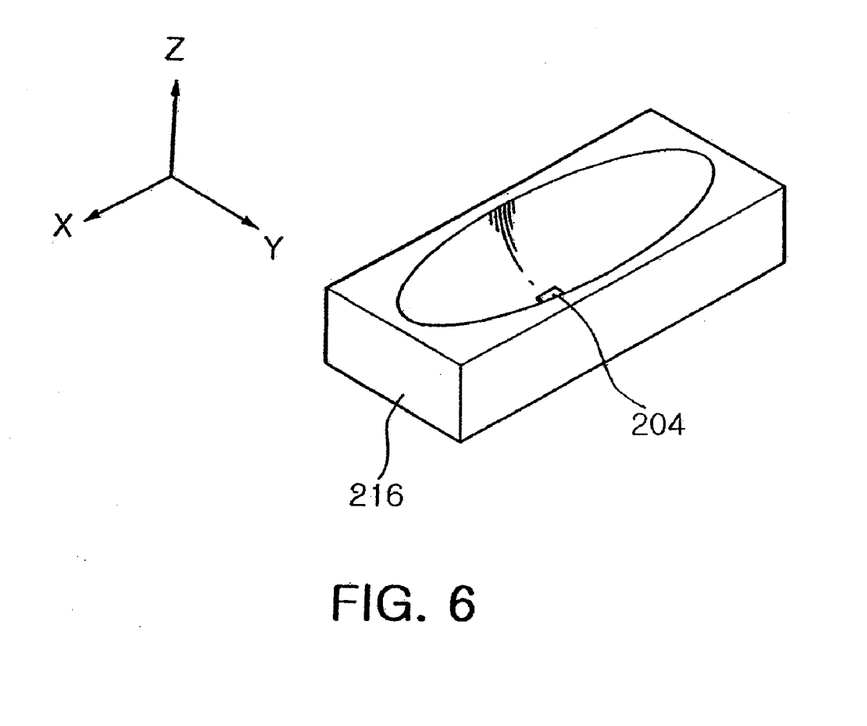
FIG. 6 is a perspective view of a reflector of the multi-lens LED according to the second embodiment of the present invention.

Hereinafter a multi-lens LED according to a second embodiment of the invention will be described with reference to FIGS. 4 to 6, in which FIG. 4 is a perspective view of a multi-lens LED according to the second embodiment of the present invention, FIG. 5 is a cross-sectional view of the multi-lens LED taken along the line V—V in FIG. 4, and FIG. 6 is a perspective view of a reflector of the multi-lens LED according to the second embodiment of the present invention.

As shown in FIGS. 4 to 6, a multi-lens LED 200 according to the second embodiment of the invention includes a board 202 printed with patterns (not shown), an LED chip 204 mounted on the board 202, a first lens 206 for sealing the LED chip 204 and a second lens 210 placed around the first lens 206 at a predetermined space. In this case, an intermediate layer 208 is formed of the air filled between the first and second lenses 206 and 210. The first and second lenses 206 and 210 are shaped as a partial cylinder that is taken along the y-axis.

Though not shown in FIGS. 4 to 6, the multi-lens LED 200 of the invention also has several components provided in the board 202 like a typical LED. These components include leads for supplying external voltage to the LED chip 204, a semi-elliptical reflector 216 for reflecting light emitted from the LED chip 204 in an upward direction and a metal pad for radiating heat generated from the LED chip 204 to the outside.

As shown in FIG. 6, the reflector 216 is extended in the x-axial direction but formed narrow in the y-axial direction in order to direct light beams L emitted from the LED chip 204 in the x- and y-axial directions, i.e., radial directions of the multiple lenses 206 and 210.

The first and second lenses 206 and 210 are molded from transparent resin, and alternatively, may be formed of other transparent material such as plastic and glass. In addition, gel-like elastic resin such as silicone can be filled between the first lens 206 and the LED chip 204 in order to stably protect the LED chip 204 against thermal stress, vibration and external impact.

The first lens 206 forms a portion of a cylinder C which is drawn in part with a dotted line. The cylinder has a center C1 placed behind the LED chip 204 when seen in the propagation direction of light. In addition, the second lens 210 is a portion of a hollow cylinder in which inner and outer surfaces 212 and 214 have different diameters and centers. In this case, though not shown in detail, the cylinders are centered in common behind the LED chip 204 when seen in the propagation direction of light. In addition, the inner surface 212 is centered ahead of the outer surface 214 when seen in the propagation direction of light. Accordingly, the second lens 210 which is delineated by the first and second surfaces 214 and 216 has a concave lens structure. The second lens 210 has the smallest thickness $t_1$ in a central portion of the second lens 210 located in the direct front of the LED chip 204 when seen in the propagation direction of light (or directly upward from the LED chip 204 in FIG. 5) and the largest thickness $t_2$ in marginal portions of the lens 210 in contact with the board 202.

The multi-lens LED 200 of the second embodiment as described above has a radial cross-sectional configuration along the x- and z-axial directions the same as that of the multi-lens LED 100 of the first embodiment. Therefore, it is to be understood that the multi-lens LED 200 of this embodiment operates in the same fashion as the multi-lens LED 100 of the first embodiment when seen in the radial direction of the first and second lenses 206 and 210.

In the meantime, since the reflector 216 serves to limit the spreading of the light beams L in the y-axial direction, the multi-lens LED 200 of this embodiment provides the radiation beams L with a narrow y-axial beam angle but a wide radial beam angle.

As in the first embodiment, modification to the refractivity and configuration of the multiple lenses 206 and 210 of this embodiment may spread the light beams L to have a radial beam angle increased up to 180°. In addition, the present invention can increase the number of lenses to more efficiently increase or adjust the beam angle.

Since the multi-lens LED 200 of this embodiment increases the beam angle of the beams L in two axial directions while narrowing the beam angle in one axial direction, it is appropriate especially for a light source of an edge emitting LED backlight apparatus.

Hereinafter an application of the multi-lens LED 200 of this embodiment will be described with reference to a schematic perspective view in FIG. 7. Herein, FIG. 7 will be illustrated with a coordinate system having orientations the same as those of the multi-lens LED 200 in FIG. 4 for the convenience's sake.

Figure 7:
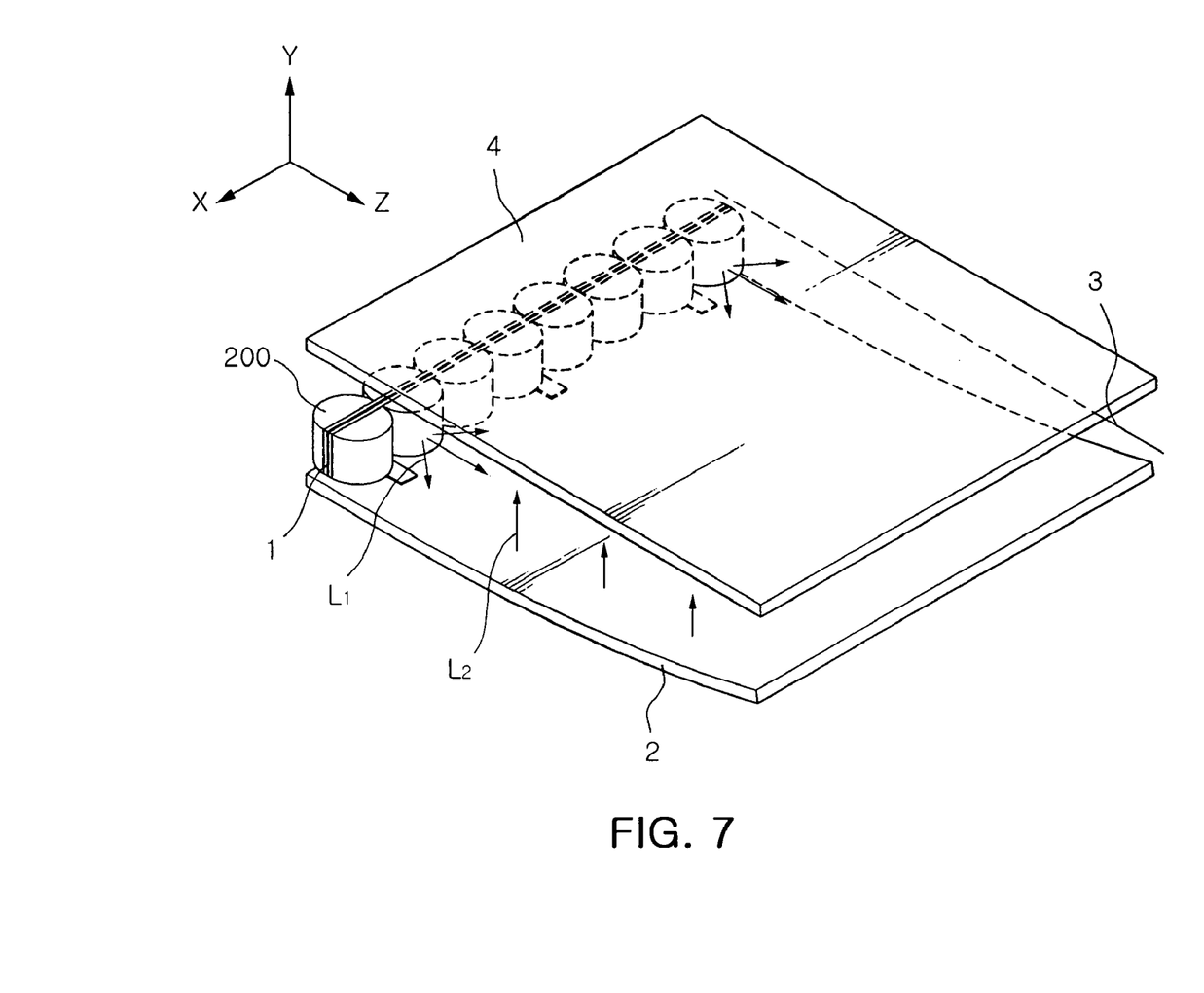
FIG. 7 is a perspective view schematically illustrating an illustrative application of the multi-lens LED according to the second embodiment of the present invention.

In FIG. 7, the reference numeral 2 represents a reflector of an LCD backlight apparatus, and the reference numeral 4 represents an LCD panel. The reflector 2 is extended in the z-axial direction while being gradually rising in the y-axial direction. In addition, two upwardly inclined reflectors 3 are attached to both sides of the reflector 2, in which only one of the reflectors 3 is illustrated for the convenience's sake. An array of multi-lens LEDs 200 as of the second embodiment are attached to a support member such as a bar 1.

Then, when the array of the multi-lens LEDs 200 radiate light beams L1, the beams L1 are reflected by the reflectors 2 and 3 and mixed together. The mixed beams L2 propagate toward the LCD panel 4 so as to backlight the LCD panel 4.

Figure 8:
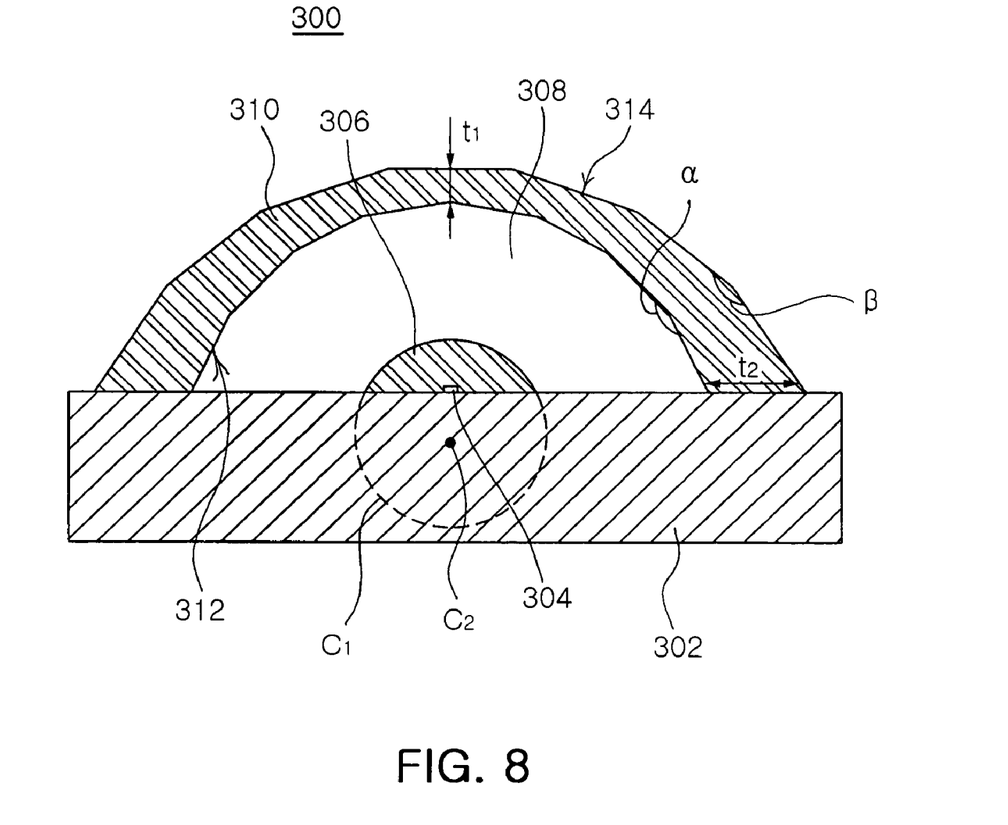
FIG. 8 is a sectional view of a multi-lens LED according to a third embodiment of the present invention.

Hereinafter a multi-lens LED 300 according to a third embodiment of the invention will be described with reference to FIG. 8. As shown in FIG. 8, a multi-lens LED 300 of the third embodiment has a cross-sectional configuration substantially the same as that of the first and second multi-lens LED 100 and 200 in FIGS. 2 and 5, respectively, except that inner and outer surfaces 312 and 314 of a second lens 310 are defined by a plurality of straight lines that are connected with adjacent ones at predetermined angles α and β, respectively.

Therefore, where the multi-lens LED 300 of the third embodiment has a generally hemispherical configuration, its construction and operation would be substantially the same as those of the multi-lens LED 100 of the first embodiment. On the other hand, where the multi-lens LED 300 has a generally semi-cylindrical configuration, its construction and operation would be substantially the same as those of the multi-lens LED 200 of the second embodiment.

Figure 9:
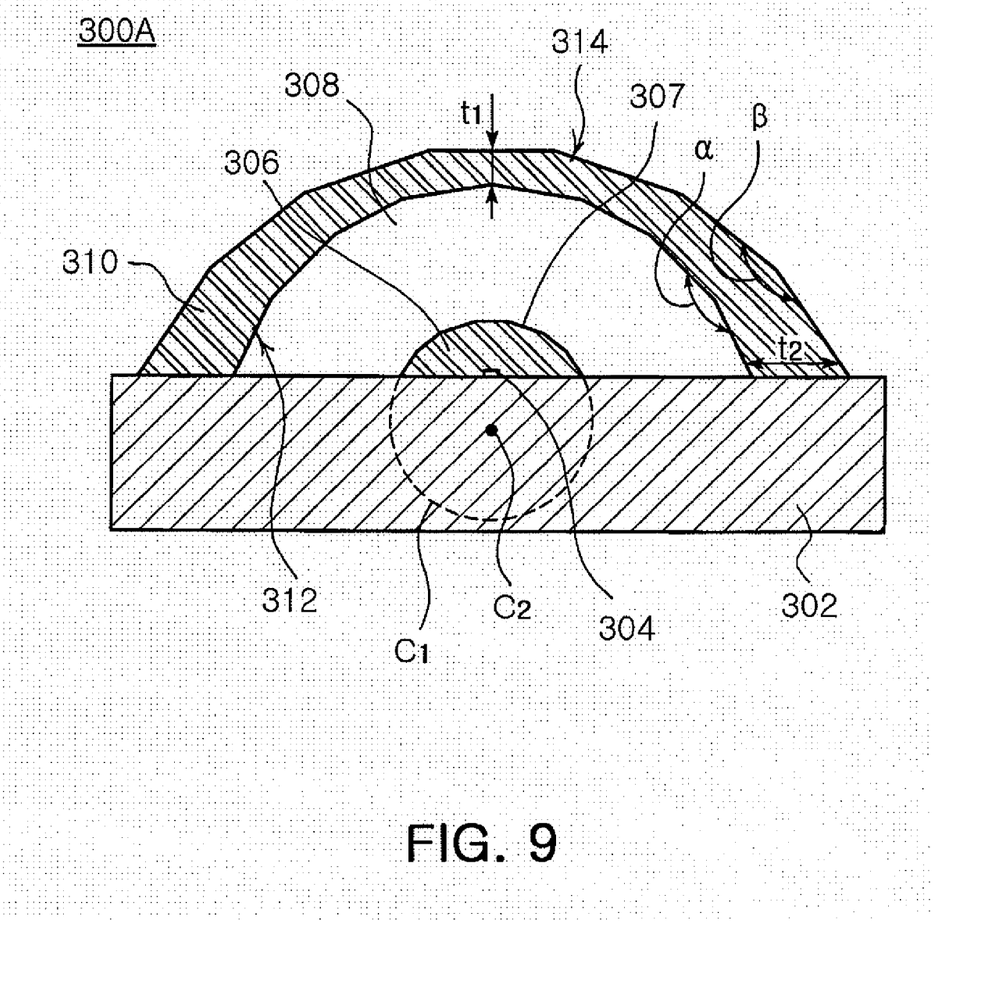
FIG. 9 is a cross-sectional view of a variation to the multi-lens LED shown in FIG. 8.

Although it has been described that the first lens 306 is a portion of a sphere, its surface may be faceted as the outer surface 314 of the second lens 310. In FIG. 9, the first lens 306 has a faceted outer surface 307.

As described hereinbefore, certain embodiments of the present invention provides the dual lenses and the intermediate layer interposed between the dual lenses so that the beam angle of light emitted from the LED chip can be adjusted into a specific range.

For example, when the first lens is centered behind the LED chip when seen in the propagation direction of light, the second lens has a concave structure and surrounds the first lens, and the intermediate layer is interposed between the first and second lenses, light emitted from the LED chip can be radiated in a wide beam angle up to about 180°. When provided in the form of a hemisphere, the multi-lens LED of the present invention can be attached to for example a wall or a ceiling in use for interior lighting. On the other hand, when provided in the form of a cylinder, the multi-lens LED of the present invention can be applied in arrays to be used as a light source of an LCD backlight apparatus.

In addition, the first lens may be centered ahead of the LED chip when seen in the propagation direction of light and the second lens may be of a convex configuration to surround the first lens with the intermediate layer being interposed between the first and second lenses so that light from the LED chip can radiate in a narrow beam angle, in particular, in a specific direction.

While the present invention has been shown and described in connection with the preferred embodiments, it will be apparent to those skilled in the art that various modifications and alterations can be made without departing from the spirit and scope of the present invention as defined by the appended claims.

What is claimed is:

1. A multi-lens Light Emitting Diode (LED), comprising:
a board;
an LED chip mounted on the board;
a substantially hemispherical first lens placed on a planar surface of the board and surrounding the LED chip to direct light emitted from the LED chip in a predetermined range of beam angle;
a substantially hemispherical second lens placed on the planar surface of the board and around the first lens;
an intermediate layer interposed between the first and second lenses, and made of a material having a refractivity different from those of the first and second lenses; and
a transparent elastic body tightly contacting an inner surface of the first lens while sealing the LED chip.

2. The multi-lens LED according to claim 1, wherein the first lens is smaller than a hemisphere, and the second lens is a concave lens.

3. The multi-lens LED according to claim 1, wherein the first and second lenses are made of a resin having a refractivity of at least 1.5, and the intermediate layer is an air layer.

4. The multi-lens LED according to claim 1, wherein the transparent elastic body has a refractivity substantially the same as that of the first lens.

5. The multi-lens LED according to claim 1, wherein the first lens has an outer surface including a number of planar faces,
each of the faces being connected with an adjacent one of the faces and being slanted at a predetermined angle relative to said adjacent face.

6. The multi-lens LED according to claim 1, wherein the second lens has inner and outer surfaces,
at least one of the inner and outer surfaces including a number of faces,
each of the faces being connected with an adjacent one of the faces and being slanted at a predetermined angle relative to said adjacent face.

7. The multi-lens LED according to claim 1, further comprising at least one substantially hemispherical third lens placed on the planar surface of the board and around the second lens at a predetermined space.

8. A multi-lens Light Emitting Diode (LED), comprising:
a board;
a reflector on the board;
an LED chip mounted within the reflector which is shaped to spread light with a wider range of beam angle in a first axial direction than in a second axial direction perpendicular to the first axial direction;
a substantially semi-cylindrical first lens placed on the board surrounding the LED chip;
a substantially semi-cylindrical second lens placed on the board around the first lens; and an intermediate layer interposed between the first and second lenses, and made of a material having a refractivity different from those of the first and second lenses.

9. The multi-lens LED according to claim 8, wherein the first lens is smaller than the half of a cylinder, and wherein the second lens is a concave lens.

10. The multi-lens LED according to claim 8, wherein the first and second lenses are made of a resin having a refractivity of at least 1.5, and the intermediate layer is an air layer.

11. The multi-lens LED according to claim 8, further comprising a transparent elastic body tightly contacting an inner surface of the first lens while sealing the LED chip, the transparent elastic body having a refractivity substantially the same as that of the first lens.

12. The multi-lens LED according to claim 8, wherein the first lens has an outer surface including a number of planar faces,
    each of the faces being connected with an adjacent one of the faces and being slanted at a predetermined angle relative to said adjacent face.

13. The multi-lens LED according to claim 8, wherein the second lens has inner and outer surfaces,
    at least one of the inner and outer surfaces including a number of faces,
    each of the faces being connected with an adjacent one of the faces and being slanted at a predetermined angle relative to said adjacent face.

14. The multi-lens LED according to claim 8, further comprising at least one substantially semi-cylindrical third lens placed on the board around the second lens at a predetermined space.

15. The multi-lens LED according to claim 8, wherein each of said semi-cylindrical first and second lenses is elongated in the second axial direction.

16. The multi-lens LED according to claim 15, wherein said reflector is elongated in the first axial direction.

17. The multi-lens LED according to claim 14, wherein each of said semi-cylindrical first, second and third lenses has an axis parallel with the second axial direction.

18. The multi-lens LED according to claim 8, wherein
    said semi-cylindrical first and second lenses are placed on a planar surface of said board;
    the first and second axial directions are parallel with said planar surface; and
    said reflector is shaped to spread light in said first axial direction and focus light in said second axial direction.

19. A multi-lens Light Emitting Diode (LED), comprising:
    a board;
    an LED chip mounted on the board;
    a substantially hemispherical or semi-cylindrical first lens placed on the board and surrounding the LED chip to direct light emitted from the LED chip in a predetermined range of beam angle;
    a substantially hemispherical or semi-cylindrical second lens placed on the board around the first lens and having a configuration corresponding to that of the first lens; and
    an air layer interposed between the first and second lenses;
    wherein the first and second lenses are made of a resin having a refractivity of at least 1.5.

20. The multi-lens LED according to claim 19, wherein
    said LED chip is mounted within a reflector on the board, the reflector being adapted to spread light with a wider range of beam angle in one axial direction than in another axial direction; and
    said first and second lenses are substantially semi-cylindrical lenses having axes parallel with said another axial direction.

* * * * *